US010163609B2

(12) United States Patent
Lin et al.

(10) Patent No.: US 10,163,609 B2
(45) Date of Patent: Dec. 25, 2018

(54) PLASMA GENERATION FOR ION IMPLANTER

(71) Applicant: TAIWAN SEMICONDUCTOR MANUFACTURING CO., LTD., Hsin-Chu (TW)

(72) Inventors: Tsung-Min Lin, Zhubei (TW); Ming-Hsing Li, Hsin-Chu (TW); Fang-Chi Chien, Hsinchu (TW); Chao-Li Shih, Jhudong Township (TW); Hong-Hsing Chou, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/475,196

(22) Filed: Mar. 31, 2017

(65) Prior Publication Data
US 2018/0174807 A1    Jun. 21, 2018

Related U.S. Application Data

(60) Provisional application No. 62/434,682, filed on Dec. 15, 2016.

(51) Int. Cl.
*H01J 37/00* (2006.01)
*H01J 37/32* (2006.01)
*H01L 21/265* (2006.01)

(52) U.S. Cl.
CPC .. *H01J 37/32678* (2013.01); *H01J 37/32192* (2013.01); *H01J 37/32412* (2013.01); *H01J 37/32651* (2013.01); *H01L 21/265* (2013.01); *H01J 37/32229* (2013.01); *H01J 2237/3365* (2013.01)

(58) Field of Classification Search
CPC .......... H01J 37/32678; H01J 37/32192; H01J 37/32412; H01J 37/32651; H01J 37/32229; H01J 2237/3365; H01L 21/265
USPC ............................................. 250/423 R, 424
See application file for complete search history.

(56) References Cited

U.S. PATENT DOCUMENTS

| 4,778,561 A | 10/1988 | Ghanbari |
| 5,463,226 A * | 10/1995 | Matsuzaki ............. G01R 23/04 |
| | | 250/336.1 |
| 2005/0242293 A1 | 11/2005 | Benveniste |
| (Continued) | | |

OTHER PUBLICATIONS

"Electron cyclotron resonance", from Wikipedia, https://en.wikipedia.org/wiki/Electron_cyclotron_resonance, 4 pages.

*Primary Examiner* — Nicole Ippolito
*Assistant Examiner* — Hanway Chang
(74) *Attorney, Agent, or Firm* — Duane Morris LLP

(57) ABSTRACT

An ion implanter comprises a dissociation chamber in the ion implanter. The dissociation chamber has an input port for receiving a gas and an output port for outputting ions. A vacuum chamber surrounds the dissociation chamber. A plurality of rods or plates of magnetic material are located adjacent to the dissociation chamber on at least two sides of the dissociation chamber. A magnet is magnetically coupled to the plurality of rods or plates of magnetic material. A microwave source is provided for supplying microwaves to the dissociation chamber, so as to cause electron cyclotron resonance in the dissociation chamber to ionize the gas.

20 Claims, 6 Drawing Sheets

(56) References Cited

U.S. PATENT DOCUMENTS

2014/0231669 A1* 8/2014 Takahashi ............... H01J 27/16
250/424

* cited by examiner

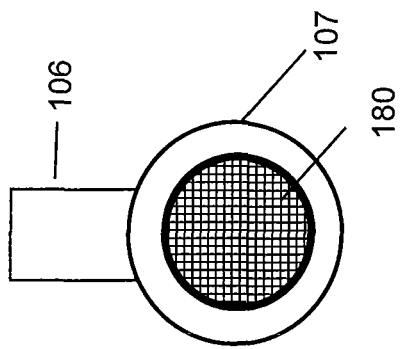
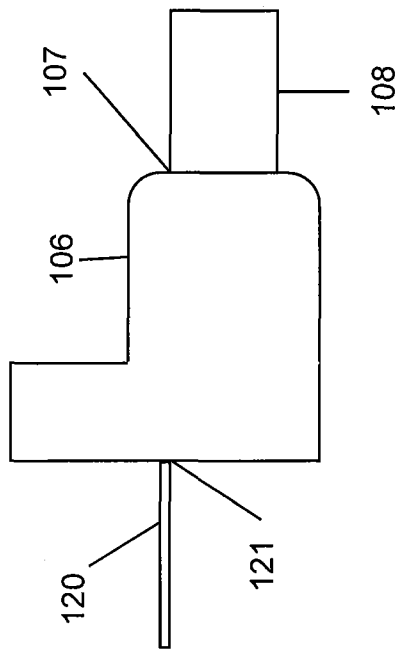

PLASMA GENERATION FOR ION IMPLANTER

PRIORITY CLAIM AND CROSS-REFERENCE

This application claims the benefit of U.S. Provisional Patent Application No. 62/434,682. filed Dec. 15, 2016, which is expressly incorporated herein by reference in its entirety.

BACKGROUND

Ion implanters are used in semiconductor fabrication to introduce impurity ions (also referred to as dopants) into semiconductor materials. The implanter generates a plasma containing the impurity ions. An electro-magnetic field accelerates the ions to an energy of 2 keV or more, so the ions implant below the surface of the semiconductor substrate.

A Hall-current ion implanter uses a heated filament or hot cathode to generate hot electrons for dissociation. The hot electrons bombard process gas molecules within a dissociation chamber, causing ionization, and released electrons continue striking other gas molecules to create more ions in a chain reaction until the ions touch the arc chamber wall.

Over time, the hot filament and cathode can oxidize and be consumed, so that vaporized tungsten atoms are sputtered. This generates byproducts and reduces the source head lifetime.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Like reference numerals in two or more drawings indicate the same components.

FIG. 4 is an enlarged view of the dissociation chamber of FIG. 1, in accordance with some embodiments.

FIG. 5 is a front view of the dissociation chamber of FIG. 4, in accordance with some embodiments.

DETAILED DESCRIPTION

Figure 1:
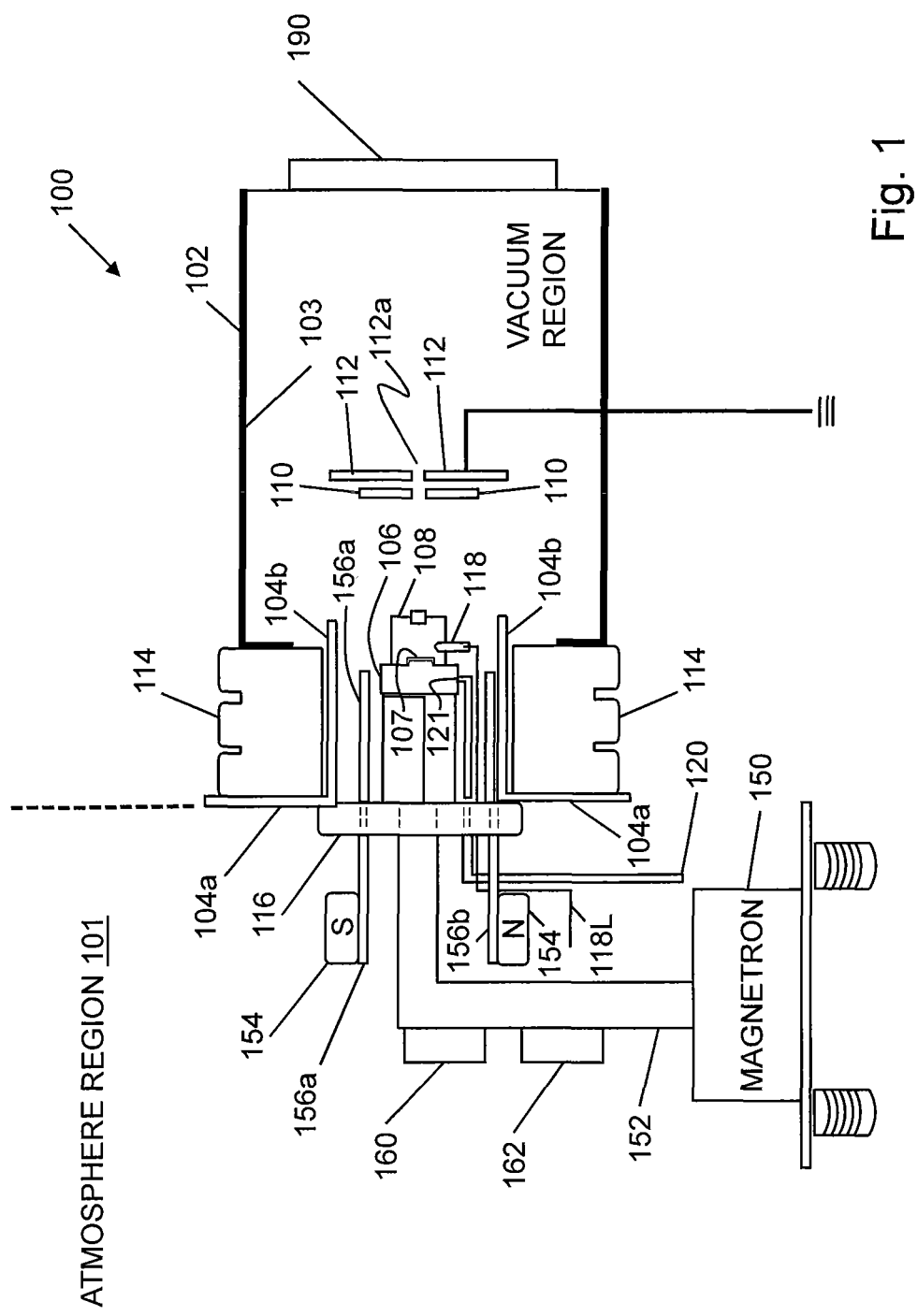
FIG. 1 is a schematic diagram of an ion implanter, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are, formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an ion implanter is configured to perform gas dissociation using electron cyclotron resonance. A magnetic field is established in the dissociation chamber and a microwaves signal is fed into the dissociation chamber to cause electron cyclotron resonance. In some embodiments, the magnetic field is provided to a dissociation chamber within a compact vacuum housing using a magnet located outside of the housing. In some embodiments, a plurality of rods or plates of magnetic material can couple the magnet outside the housing to the dissociation chamber. In some embodiments, a grid is placed at an output port of the dissociation chamber to separate the microwaves from the plasma.

FIG. 1 is a schematic diagram of an implanter system 100 according to some embodiments. The system 100 has two distinct regions: an atmosphere region 101 and a vacuum region 102.

The ion implanter 100 comprises a dissociation chamber 106 within the vacuum region 102 of the ion implanter 100, for dissociation of a gas into ions. FIGS. 4 and 5 are enlarged schematic diagrams of the dissociation chamber 106. The dissociation chamber 106 has an input port 121 for receiving gas from a gas conduit 120, and an output port 107 for outputting the ions to a plasma chamber 108. The ions are collected in the plasma chamber 108, to be implanted into the surface of a semiconductor substrate 190. In this process, the ions are referred to as a dopant, and the implanted ions can be boron, phosphorus, or other species that alters carrier mobility in a thin layer of the substrate 190.

The dissociation chamber 106 and plasma chamber 108 are inside a vacuum chamber 102. The vacuum chamber 102 has a chamber wall 103, a flange with outer portion 104a and inner portion 104b, and an isolating bushing 114 made of a non-conductive material. The flange 104a/104b is a representation of the source head body (Hall current body). A plate 116 sealingly engages the outer surface 104a. Together, the chamber wall 103, inner flange portion 104b, bushing 114 and plate 116 form the sealed housing of the vacuum region 102.

The flange 104a, 104b is maintained at a high voltage during plasma formation, such as a voltage in a range from 0 Volts to 250K Volts. The vacuum chamber wall 103 is grounded. The ions (not shown) exiting the plasma chamber are positively charged. An extraction plate 112 is coupled to ground, creating an electrical field between the output port of the plasma chamber 108 and the extraction plate 112. The extraction plate 112 attracts the ions from the plasma chamber 108, to direct an ion beam through an opening 112a in the extraction plate toward the substrate 190. As the extraction plate 112 is bombarded by ions, the extraction plate also releases secondary electrons. A suppression plate 110 prevent the secondary electrons from impacting the plasma chamber 108. The flange 104a, 104b, chamber wall 103, extraction plate 112, and suppression plate 110 all comprise a highly conductive material, such as aluminum, copper or other metal or alloy.

A microwave source 150 located in the atmosphere region 101 provides electromagnetic waves (such as microwaves) to the dissociation chamber 106 for causing electron cyclotron resonance in the dissociation chamber 106 to ionize the gas. In some embodiments, the microwave source is a magnetron 150. In other embodiments, the microwave source can be a klystron or traveling-wave tube (TWT).

A microwave transmission medium 152 is connected between the microwave source 150 and the dissociation chamber 106. In some embodiments, the microwave transmission medium 152 is a waveguide, such as an S band waveguide. During plasma generation, the waveguide 152 is maintained at a high voltage. In the embodiment of FIG. 1, the waveguide has a bend (which can be an H-bend or an E-bend). In other embodiments, depending on the location of the microwave source there can be zero bends or any number of bends. In some embodiments, the waveguide has a matching device 168 (FIG. 2) to minimize reflection of the microwave energy.

For causing electron cyclotron resonance, the microwaves have a frequency of 2.45 GHz. At 2.45 GHz, based on the electron charge and electron mass, the resonance condition is met when a magnetic field B of 875 Gauss (=0.0875 Tesla). In some embodiments, a permanent magnet 154 generates a constant magnetic field of 875 Gauss. In other embodiments (not shown), an electromagnet having a constant current provides the constant magnetic field.

Figure 2:
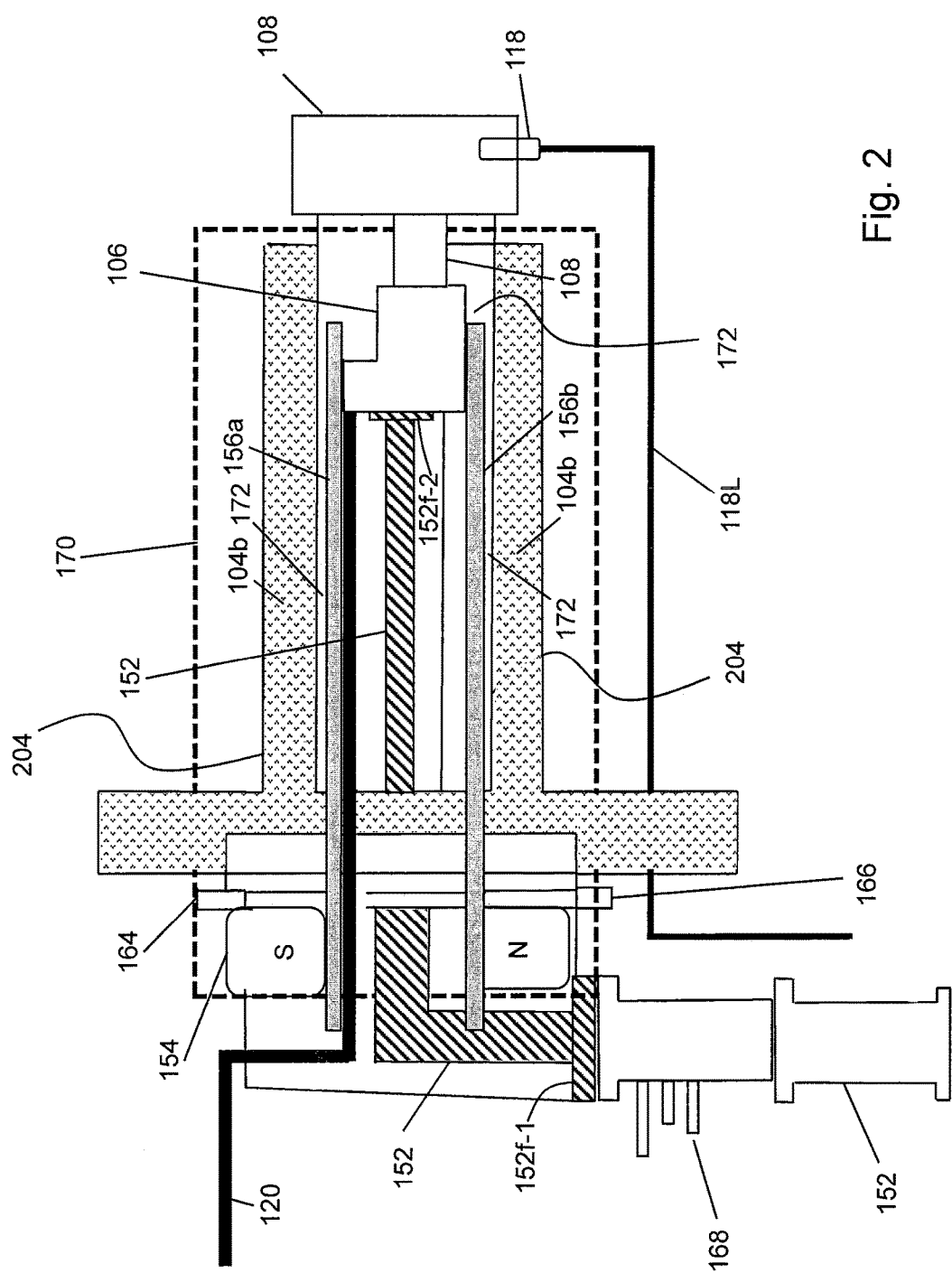
FIG. 2 is a diagram of the implanter of FIG. 1, in accordance with some embodiments.

In some embodiments, as best seen in FIG. 2, a narrow annular space 172 separates the dissociation chamber 106 from the tubular inner flange portion 104b. For example, in some embodiments, for purpose of compactness, the flange 104a, 104b and dissociation chamber 106 are designed with an annular space 172 between the dissociation chamber 106 and the inner flange portion 104b, and the distance between the inner and outer diameters of the annular space 172 is too small to receive the magnet 154. In other embodiments, the flange 104a, 104b and dissociation chamber 106 are legacy components with a fixed size. For example, the flange 104a, 104b and dissociation chamber 106 can be original or aftermarket components fabricated for compatibility with a Varian E500 or E220 implanter sold by Varian, Inc. of Palo Alto, Calif.

As noted above, the waveguide 152 and flange 104a, 104b are maintained at a high voltage. To avoid arcing between the grounded chamber wall 103 and the high voltage waveguide 152 and/or inner flange portion 104b, the magnet 154 is located in the atmosphere region 101, outside the vacuum region 102.

A structure 156a, 156b is included for providing the magnetic field from the magnet 154 in the atmosphere region to the dissociation chamber 106. In some embodiments, the permanent magnet 154 is magnetically coupled to a magnetic material 156a, 156b which in turn produces a magnetic field in the dissociation chamber 106. In some embodiments, the material includes one or more ferromagnetic materials, such as CoFe, CoFeB, NiFe, or NiFeCo. In other embodiments, the material includes one or more paramagnetic materials, such as magnesium, molybdenum, lithium, or tantalum. For example, the magnetic material 156a, 156b can comprise a ferromagnetic or paramagnetic material in the form of a plurality of rods or plates. In some embodiments, the material is formed as flat plates 156a, 156b on two opposite sides of the dissociation chamber 106. In other embodiments, the plates 156a, 156b are curved. The curved plates (not shown) can be concentric with the inner flange portion 104b. The plurality of rods or plates 156a, 156b extend from the magnet 154 to the dissociation chamber 106. The rods or plates 156a, 156b are configured to form a substantially uniform 875 Gauss magnetic field within the dissociation chamber 106, which in combination with the electric field E from the 2.45 GHz microwaves is capable of causing electron cyclotron resonance in the gas. In some embodiments, the magnetic material terminates in rectangular plates 156a, 156b, each sized approximately 7 cm by 25 cm. The plates should be large enough to provide a substantially uniform magnetic field of 875 Gauss in the dissociation chamber, and small enough to fit within the annular region 172 without contacting the source body 204, and not causing arcing.

The magnetic field of the magnet 154 induces a magnetic field in the rods or plates 156a, 156b in the same direction as the magnetic field of the magnet 154. In some embodiments, the rods or plates 156a, 156b contact the south and north poles, respectively, of the magnet 154 to maximize the induced magnetic field in rods or plates 156a, 156b. In other embodiments, the rods or plates 156a, 156b are located very close to the south and north poles, respectively, of the magnet 154. Similarly, to maximize the induced magnetic field in the dissociation chamber 106, the rods or plates 156a, 156b are positioned very close to the dissociation chamber 106. The dissociation chamber 106 has a dielectric wall (e.g., a quartz) to permit the magnetic field in the rods or plates 156a, 156b pass through the walls of the dissociation chamber 106.

In the arrangement shown in FIG. 2, the microwaves are transmitted at 2.45 GHz into the dissociation chamber 106 in the longitudinal direction of the waveguide 152. The magnetic field B of 875 Gauss is aligned in the vertical direction, perpendicular to the electrical field. A low pressure gas is provided through the gas line 120 to the dissociation chamber 106. The electric field is synchronous with the gyration period of free electrons in the gas and increase their kinetic energy in the direction normal to the electrical and magnetic fields. These high energy electrons collide with the gas molecules and causes dissociation.

In some embodiments, a Langmuir probe 118 with a signal line 118L measures the electron temperature, electron density and electric potential of the plasma in the plasma chamber 108. The plate 116 allows the line 118L, the magnetic material rods or plates 156a, 156b, and the gas line 120 to enter the vacuum region 102 while keeping the atmosphere out of the vacuum region 102.

In some embodiments, a circulator 162 provides cooling fluid to the system. For example, FIG. 2 shows a water input 164 and a water output 166 which can be connected to the circulator 162. In some embodiments, a matching circuit 160 minimizes reflection of the microwaves, and maximize the microwave energy imparted to the plasma.

FIG. 2 is a diagram of an embodiment of the ion implanter of FIG. 1, in accordance with some embodiments. Although not to scale, FIG. 2 more clearly shows the shape of the source head body 204, which corresponds to the flange 104a, 104b of FIG. 1. FIG. 2 also shows the limited annular space 172 between the dissociation chamber 106 and the source head body 204 of the vacuum region 102. As best seen in FIG. 2, in some embodiments, the magnet 154 has an outer diameter greater than an inner diameter of the source head housing 204, and thus cannot fit inside the housing without altering or replacing the housing.

In some embodiments, the source head body 204, the dissociation chamber 106 and the plasma chamber 108 are legacy components from (or compatible with) a Varian E500 or E220 Implanter or other implanter using a hot filament (not shown) in an arc chamber (not shown) to ionize the feed gas. A kit containing the microwave source (e.g., magnetron) 150, microwave transmission medium (e.g., waveguide 152), magnet 154 and rods or plates of magnetic material 156*a*, 156*b* can be retrofitted into an existing legacy implanter. The filament is removed from the implanter. The electromagnet (not shown) inside the vacuum housing (adjacent the dissociation chamber) is also removed. The kit including the microwave source (e.g., magnetron) 150, microwave transmission medium (e.g., waveguide 152), magnet 154 and rods or plates of magnetic material 156*a*, 156*b* are substituted. Following the substitution, a respective portion of each of the plurality of rods or plates 156*a*, 156*b* extends beyond an end of the vacuum chamber, and the magnet 154 is adjacent to (and can contact) the respective portion of each of the plurality of rods plates 156*a*, 156*b*. As shown in FIG. 2, the magnet 154 can be too large to fit in the annular space 172 between the dissociation chamber 106 and the source head body 204. For example, a permanent magnet 154 for creating a magnetic field of 875 Gauss can be larger than an electro-magnet of a type used to accelerate ions formed by a hot filament. The rods or plates of magnetic material 156*a*, 156*b* allow use of a magnet 154 of any physical dimensions.

In other embodiments (not shown), ECR is used for plasma generation in an ion implanter, and the magnet diameter can be equal to or less than the inner diameter of the source head body 204. For example, in some embodiments, the source head body 204 has a larger inner diameter, and the magnet is positioned between the source head body and the rods or plates of magnetic material 156*a*, 156*b*.

Figure 3:
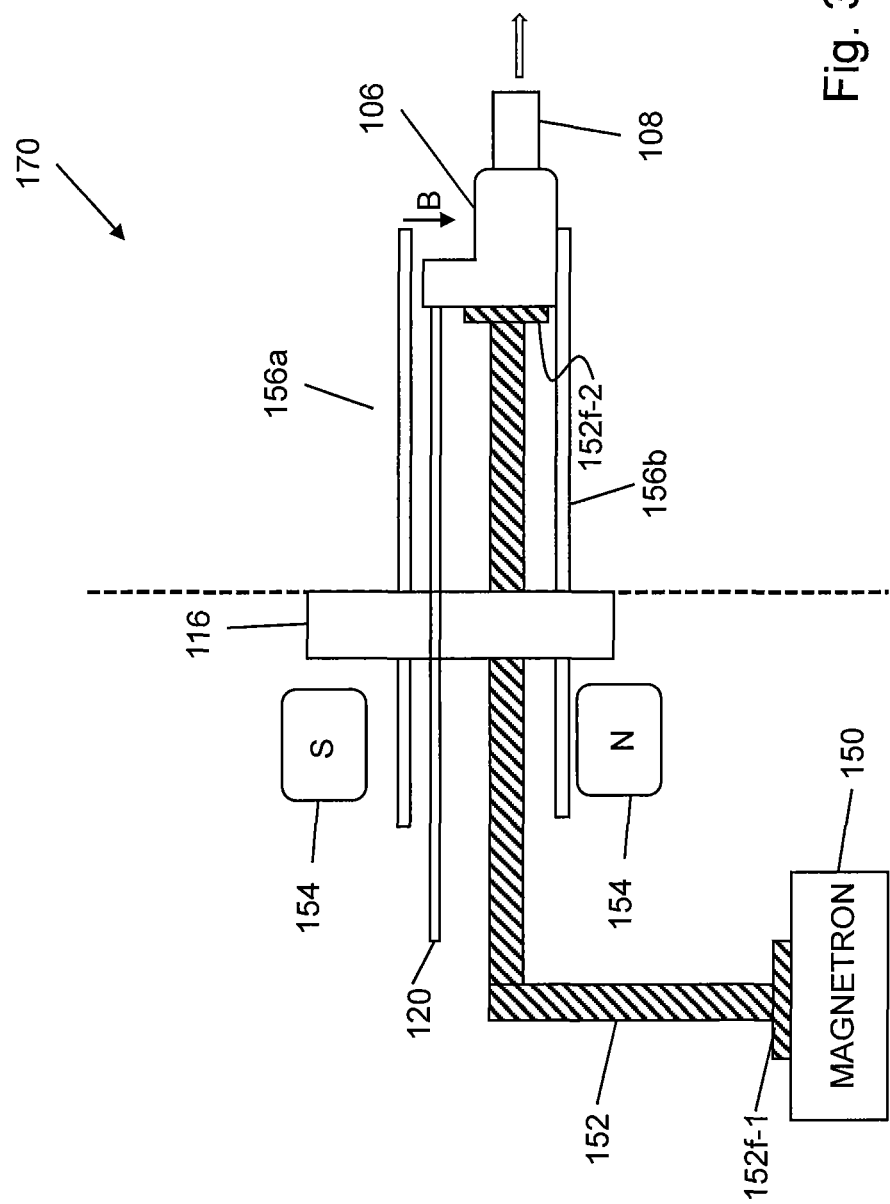
FIG. 3 is a simplified schematic diagram of an ion implanter, in accordance with some embodiments.

FIG. 3 is a schematic diagram showing the components of a retrofit kit for converting a hot filament ionization system of an implanter to an electron cyclotron resonance system, in accordance with some embodiments. Thus, in some embodiments, the microwave source (e.g., magnetron) 150, microwave transmission medium (e.g., waveguide 152), magnet 154 and rods or plates of magnetic material 156*a*, 156*b* are integrated into an existing (legacy) ion implanter (and the filament and electro-magnet removed) without other major hardware changes. Plasma production performance is maintained, and experiences less degradation over time (because filament consumption no longer occurs).

In other embodiments using a source head with a different configuration (not shown), the magnet 154 can be located at a different location, so long as the magnet 154 can induce a magnetic field in the dissociation chamber 106. The magnetic material 156*a*, 156*b* still extends in the longitudinal direction from the magnet 154 at least as far as the dissociation chamber 106, and is sufficiently close to the dissociation chamber 106 to induce a magnetic field of 875 Gauss in the dissociation chamber 106. In some embodiments, the plates are immediately adjacent the dissociation chamber 106.

In some embodiments, the microwaves are separated from the plasma before the ions are accelerated toward the substrate 190. By removing the microwaves from the plasma, the system avoids electrical noise, which would be picked up by control circuitry.

FIGS. 4 and 5 show a detail of the dissociation chamber 106 and plasma chamber 108, in accordance with some embodiments. As shown in FIG. 5, to separate the microwaves from the plasma, the dissociation chamber 106 has a metal grid 180 covering an exit port 107 of the dissociation chamber 106. The metal grid 180 has a grid size configured to absorb the microwaves. For example, in some embodiment, the microwave frequency is 2.45 GHz, and the grid size is configured to absorb 2.45 GHz microwaves.

In some embodiments, the microwave frequency is 2.45 GHz (wavelength 12 mm), and the grid size of metal grid 180 is about 1 mm or less, so that the ions exit through the metal grid 180, but no microwaves pass the grid.

In some embodiments, the grid 180 comprises tungsten. In other embodiments, the grid 180 comprises a high temperature metal having a melting point above the temperature of the plasma, such as a refractory metal (e.g., niobium, molybdenum, tantalum, tungsten, or rhenium).

Figure 6:
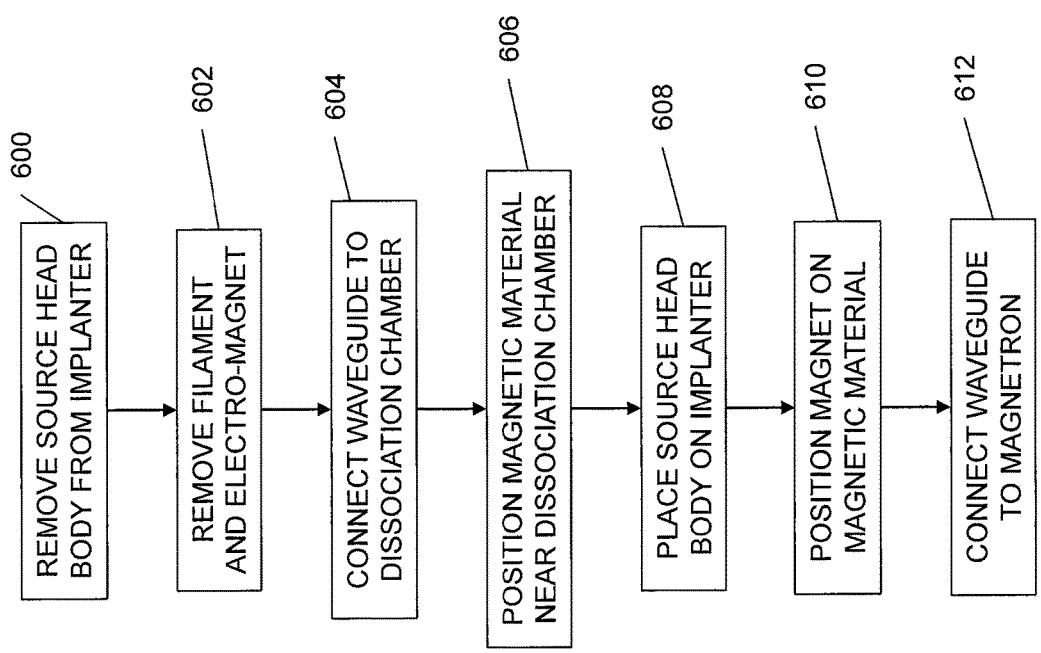
FIG. 6 is a flow chart of a method of retrofitting an ECR system into a pre-existing (legacy) implanter equipped with a hot filament plasma source according to some embodiments.

FIG. 6 is a flow chart of a method of retrofitting an ECR system in a pre-existing (legacy) implanter equipped with a hot filament plasma source according to some embodiments.

At step 600, the source head is removed from the implanter.

At step 602, the filament and electro-magnet are removed from the source head.

At step 604, a waveguide is connected to the dissociation chamber.

At step 606, rods or plates of magnetic material are positioned with one end near to the dissociation chamber, with the rods or plates on opposite sides of the chamber.

At step 608, the source head body is placed back in the implanter.

At step 610, a magnet, such as a permanent magnet, is positioned on the magnetic material, so the north pole of the magnet is on one rod or plate, and the south pole of the magnet is on the other rod or plate.

At step 612, the end of the waveguide remote from the dissociation chamber is connected to the microwave source (e.g., magnetron). The waveguide 152 can have a waveguide flange 152*f*-1, 152*f*-2 at each end. The waveguide flange 152*f*-2 adjacent the dissociation chamber 106 can have a quartz window to prevent any atmosphere in the waveguide 152 from entering the dissociation chamber 106, and vice-versa.

The waveguide flanges 152*f*-1, 152*f*-2 can be attached to the magnetron 150 by a plurality of bolts and/or dowel pins (not shown). In some embodiments, four bolts are used to attach the flange 152*f*-1, 152*f*-2 at each end of the waveguide 152 to the magnetron 150 and dissociation chamber 106. In some embodiments, the flanges 152*f*-1, 152*f*-2 are through-mounted to the waveguide 152 and brazed or soldered. In other embodiments, the flanges 152*f* are socket-mounted and soldered or brazed to the waveguide 152. The waveguide flanges 152*f*-1, 152*f*-2 can be airtight, and the waveguide 152 can have a gas therein to raise the breakdown voltage in the waveguide 152. In some embodiments, the waveguide flanges 152*f*-1, 152*f*-2 are sealed with a rubber O-ring (not shown) in a groove in the face of the waveguide flange 152*f*-1, 152*f*-2. In other embodiments, a the waveguide flanges 152*f*-1, 152*f*-2 are sealed with a flat gasket.

Figure 7:
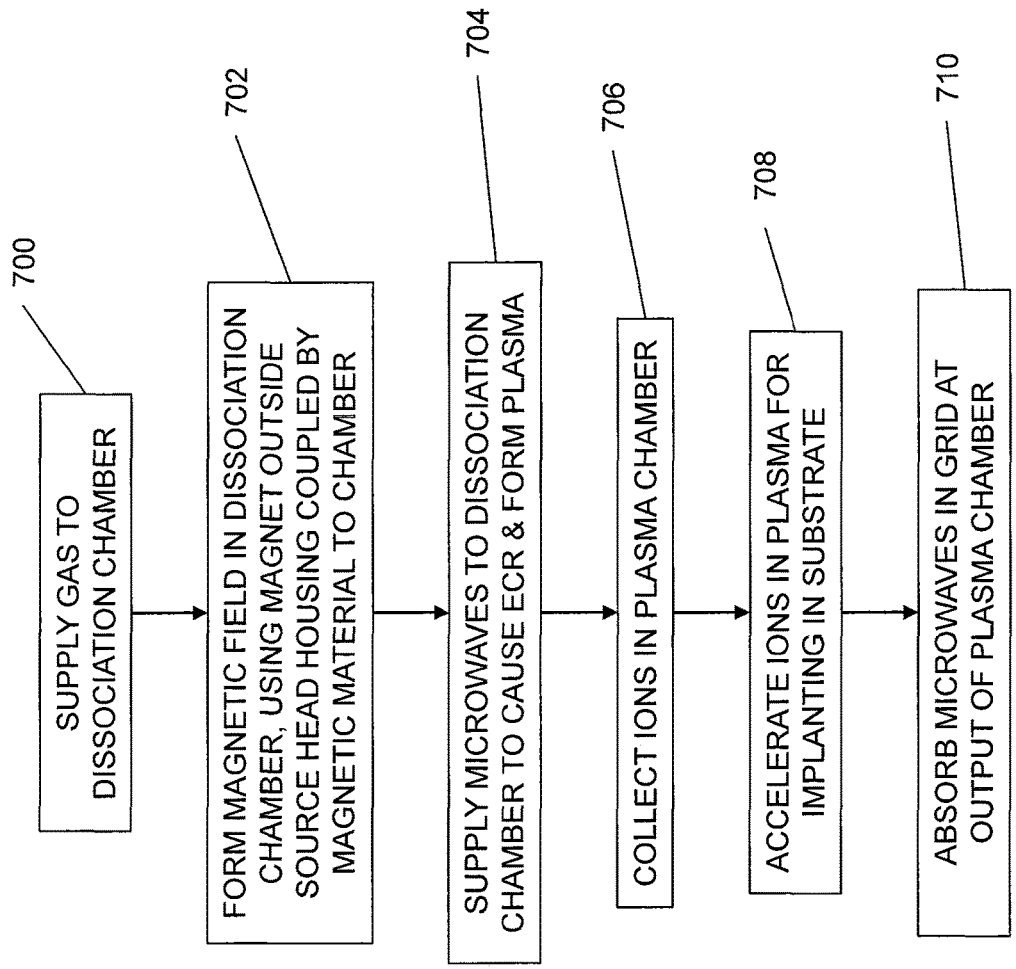
FIG. 7 is a flow chart of a method of using the ECR plasma generation system of FIG. 1, according to some embodiments.

FIG. 7 is a flow chart of a method of using the ECR plasma generation system of FIG. 1, according to some embodiments.

At step 700, a gas containing a dopant (e.g., boron, phosphorus or arsenic) is supplied via gas line 120 to a dissociation chamber 106 within a housing 204 of an implanter source head.

At step 702, a magnetic field is formed in the dissociation chamber using a magnet outside the housing. The magnet is magnetically coupled to the dissociation chamber. In some embodiments, the magnetic field is induced by the magnet in a plurality of plates of the magnetic material located adjacent to the dissociation chamber on at least two sides of the dissociation chamber.

At step 704, microwaves are supplied to the dissociation chamber, such that the microwaves and magnetic field cause dissociation of the gas by electron cyclotron resonance in the dissociation chamber 106 to form a plasma. The microwaves cause the electrons to absorb energy resonant absorption and collide with the dopant gas causing further ionization. The result is a plasma having electrons, ions, free radicals, and neutral atoms.

At step 706, plasma is collected from the dissociation chamber into a plasma chamber. Plasma is generated in the dissociation chamber 106 chamber and moves toward the collection chamber 108. The density of plasma stream extracted along the magnetic field is higher at the center of the dissociation chamber 106 than near the wall of the dissociation chamber 106. This causes the ions at the center of the dissociation chamber 106 to diffuse along magnetic flux lines toward the collection chamber 108, while the neutral atoms remain in the dissociation chamber 106.

At step 708, ions in the plasma are accelerated, so the ions have a sufficient energy for implanting the ions in the semiconductor substrate. Referring again to FIG. 1, ions from the dissociation chamber 106 are extracted from the plasma collection chamber 108 by an electric field generated by one or more extraction electrodes 112 (FIG. 1). The vacuum chamber wall 103 is grounded. The ions (not shown) exiting the plasma chamber are positively charged. The extraction plate 112 is coupled to ground, creating an electrical field between the output port of the plasma chamber 108 and the extraction plate 112. The extraction plate 112 attracts the ions from the plasma chamber 108, to direct an ion beam through an opening in the extraction plate 112 toward the substrate 190. The suppression plate 110 prevents the secondary electrons from impacting the plasma chamber 108.

At step 710, the microwaves are separated from the plasma at an exit of the dissociation chamber, by absorbing the microwaves in a grid at the output of the plasma chamber. As shown in FIG. 5, to separate the microwaves from the plasma, the dissociation chamber 106 has a metal grid 180 covering an exit port 107 of the dissociation chamber 106. The plasma passes through the grid 180 before the ion beam is drawn toward the extraction plate 112 and passes through the opening 112a in the extraction plate. The metal grid 180 absorbs the microwaves, so the microwaves do not leave the dissociation chamber 106.

Embodiments are described herein in which an ion implanter for implanting a semiconductor substrate is equipped with an ECR-based plasma generation system. In some embodiments, the ECR system is retrofitted to a legacy hot filament type ion implanter. Microwaves are supplied to the dissociation chamber, and a magnetic field is created in the dissociation chamber, so as to cause ECR when a gas is fed to the chamber. In some embodiments, the magnetic field in the dissociation chamber is created by a magnet located outside the vacuum region of the implanter source head. The magnet induces a magnetic field in rods or plates of a magnetic material that extend inside the vacuum region and include portions very close to the dissociation chamber, on opposite sides of the dissociation chamber. A metal grid at the output port of the dissociation chamber separates the microwaves from the plasma, so that only the plasma exits the chamber, so noise is reduced.

An ion implanter as described herein does not need a hot filament, and avoids consumption and oxidation of a filament. The cost of replacement filaments is avoided. Additionally, because no filament is consumed, there is no contamination due to vaporized filament material (e.g., tungsten atoms) sticking on chamber walls and generating byproducts. The ion implanters described herein have an increased lifetime with reduced maintenance costs, because there is no need to replace filaments.

In some embodiments an ion implanter comprises a dissociation chamber in the ion implanter. The dissociation chamber has an input port for receiving a gas and an output port for outputting the ions. A vacuum chamber surrounds the dissociation chamber. A plurality of rods or plates of magnetic material are located adjacent to the dissociation chamber on at least two sides of the dissociation chamber. A magnet is magnetically coupled to the plurality of rods or plates of magnetic material. A microwave source is provided for supplying microwaves to the dissociation chamber, so as to cause electron cyclotron resonance in the dissociation chamber to ionize the gas.

In some embodiments an ion implanter comprises a dissociation chamber in the ion implanter, for dissociation of a gas into ions. The dissociation chamber has an input port for receiving the gas and an output port for outputting the ions. A vacuum chamber surrounds the dissociation chamber. A magnet is magnetically coupled to generate a magnetic field in the dissociation chamber. A microwave source is provided for supplying microwaves to the dissociation chamber for causing electron cyclotron resonance in the dissociation chamber, The microwaves have a frequency, and the dissociation chamber has a metal grid covering the output port of the dissociation chamber. The grid has a grid size configured to absorb microwaves having the frequency.

In some embodiments a method of implanting ions in a semiconductor substrate comprises: supplying gas to a dissociation chamber within a housing; forming a magnetic field in the dissociation chamber using a magnet outside the housing, the magnet magnetically coupled to the dissociation chamber; supplying microwaves to the dissociation chamber, such that the microwaves and magnetic field cause dissociation of a gas by electron cyclotron resonance in the dissociation chamber to form a plasma; and accelerating ions in the plasma, so the ions have a sufficient energy for implanting the ions in the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An ion implanter, comprising:
   a dissociation chamber in the ion implanter, the dissociation chamber having an input port for receiving a gas and an output port for outputting ions;
   a vacuum chamber surrounding the dissociation chamber;
   a plurality of rods or plates of magnetic material located adjacent to and extending through a wall of the dissociation chamber on at least two sides of the dissociation chamber;
   a magnet magnetically coupled to the plurality of rods or plates of magnetic material, wherein the magnet is configured to induce a magnetic field in the magnetic material; and
   a microwave source for supplying microwaves to the dissociation chamber, so as to cause electron cyclotron resonance in the dissociation chamber to ionize the gas.

2. The ion implanter of claim 1, further comprising a housing, wherein the plurality of rods or plates are located between the housing and within the vacuum chamber.

3. The ion implanter of claim 2, wherein the magnet is located outside the vacuum chamber.

4. The ion implanter of claim 3, wherein a respective portion of each of the plurality of rods or plates extends beyond an end of the vacuum chamber, and the magnet is adjacent to the respective portion of each of the plurality of rods or plates.

5. The ion implanter of claim 1, wherein the dissociation chamber has a metal grid covering the output port of the dissociation chamber, the grid having a grid size configured to absorb microwaves generated by the microwave source.

6. The ion implanter of claim 5, wherein the grid comprises tungsten, niobium, molybdenum, tantalum, or rhenium.

7. The ion implanter of claim 1, wherein the microwave source is a magnetron head coupled to the dissociation chamber by a microwave transmission medium.

8. The ion implanter of claim 1, wherein the magnetic material includes at least one of the group consisting of CoFe, CoFeB, NiFe, and NiFeCo.

9. An ion implanter, comprising:
   a dissociation chamber in the ion implanter, for dissociation of a gas into ions, the dissociation chamber having an input port for receiving the gas and an output port for outputting the ions;
   a vacuum chamber surrounding the dissociation chamber;
   a plurality of rods or plates of magnetic material located adjacent to and extending through a wall of the dissociation chamber on at least two sides of the dissociation chamber;
   a magnet magnetically coupled to generate a magnetic field in the dissociation chamber; and
   a microwave source for supplying microwaves to the dissociation chamber for causing electron cyclotron resonance in the dissociation chamber, wherein the microwaves have a frequency, and the dissociation chamber has a metal grid covering the output port of the dissociation chamber, the grid having a grid size configured to absorb microwaves having the frequency.

10. The ion implanter of claim 9, wherein the grid comprises tungsten, niobium, molybdenum, tantalum, or rhenium.

11. The ion implanter of claim 9, further comprising a plurality of plates of magnetic material, each plate having a first portion located adjacent to the dissociation chamber on a respective side of the dissociation chamber, and wherein the magnet is magnetically coupled to the a second portion of each plate of magnetic material.

12. The ion implanter of claim 11, further comprising a housing, wherein the plurality of plates are located between the housing and the dissociation chamber.

13. The ion implanter of claim 12, wherein each of the plurality of plates extends beyond an end of the vacuum chamber remote from the dissociation chamber, and the magnet is located outside of the housing, adjacent the end of each of the plurality of plates remote from the dissociation chamber.

14. The ion implanter of claim 9, wherein the microwave source is a magnetron head electrically connected to a waveguide, the waveguide extending to the dissociation chamber.

15. The ion implanter of claim 9, wherein the magnetic material includes at least one of the group consisting of CoFe, CoFeB, NiFe, and NiFeCo.

16. The ion implanter of claim 9, wherein the magnet has a diameter greater than a diameter of the housing.

17. A method of implanting ions in a semiconductor substrate, comprising:
   supplying gas to a dissociation chamber within a housing;
   forming a magnetic field in the dissociation chamber using a magnet outside the housing and a plurality of rods or plates of magnetic material located adjacent to and extending through a wall of the dissociation chamber on at least two sides of the dissociation chamber, the magnet magnetically coupled to the dissociation chamber, wherein the magnet is configured to induce a magnetic field in the magnetic material;
   supplying microwaves to the dissociation chamber, such that the microwaves and magnetic field cause dissociation of a gas by electron cyclotron resonance in the dissociation chamber to form a plasma; and
   accelerating ions in the plasma, so the ions have a sufficient energy for implanting the ions in the semiconductor substrate.

18. The method of claim 17, wherein the step of forming the magnetic field includes supplying the magnetic field from the magnet via a plurality of plates of the magnetic material located adjacent to the dissociation chamber on at least two sides of the dissociation chamber.

19. The method of claim 18, wherein the magnetic field is provided to the dissociation chamber by rods or plates of the magnetic material extending from the magnet to a region within the housing and adjacent to the dissociation chamber.

20. The method of claim 17, further comprising:
   collecting plasma from the dissociation chamber to a plasma chamber; and
   separating the microwaves from the plasma at an exit of the dissociation chamber.

* * * * *